United States Patent [19]

Kogure

[11] Patent Number: 5,436,863

[45] Date of Patent: Jul. 25, 1995

[54] SEMICONDUCTOR MEMORY DEVICE

[75] Inventor: Kanari Kogure, Tokyo, Japan

[73] Assignee: NEC Corporation, Tokyo, Japan

[21] Appl. No.: 232,372

[22] Filed: Apr. 25, 1994

[30] Foreign Application Priority Data

Apr. 26, 1993 [JP] Japan .................................. 5-120418

[51] Int. Cl.⁶ ................................................ G11C 7/00
[52] U.S. Cl. ........................... 365/189.04; 365/189.07; 365/230.05; 365/233
[58] Field of Search ...................... 365/189.04, 189.07, 365/230.05, 189.02

[56] References Cited

U.S. PATENT DOCUMENTS

| | | | |
|---|---|---|---|
| 5,031,146 | 7/1991 | Umina | 365/189.04 X |
| 5,319,596 | 6/1994 | Kogure | 365/189.04 |
| 5,321,652 | 6/1994 | Ito | 365/189.07 |

FOREIGN PATENT DOCUMENTS

| | | | |
|---|---|---|---|
| 0149049 | 11/1984 | European Pat. Off. | |
| 2357979 | 7/1977 | France | |
| 2-123590 | 5/1990 | Japan | 365/230.05 |
| 4-85790 | 3/1992 | Japan | 365/230.05 |
| 5-100946 | 4/1993 | Japan | |

Primary Examiner—Joseph A. Popek
Assistant Examiner—Son Mai

[57] ABSTRACT

A semiconductor memory device includes a first RAM, a second RAM, a comparator, and an AND circuit. The first RAM simultaneously performs read and write operations in synchronism with a clock signal on the basis of write address data and read address data which is different from the write address data. The second RAM receives data identical to data input to the first RAM and simultaneously performs read and write operations in synchronism with a clock signal on the basis of write and read address data which are set independently of each other. The comparator compares read and write address data supplied to the second RAM and outputs a coincidence signal when the two address data coincide with each other. The AND circuit prevents destruction of stored data in the second RAM by stopping the input of a clock signal to the second RAM in accordance with the coincidence signal from the comparator.

6 Claims, 4 Drawing Sheets

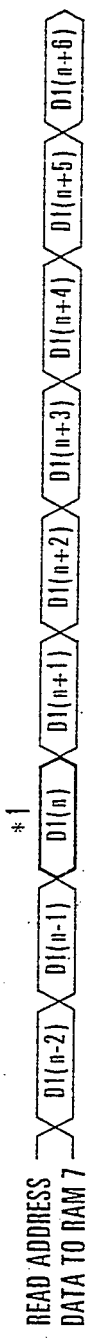
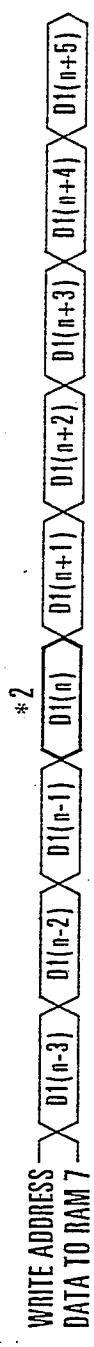
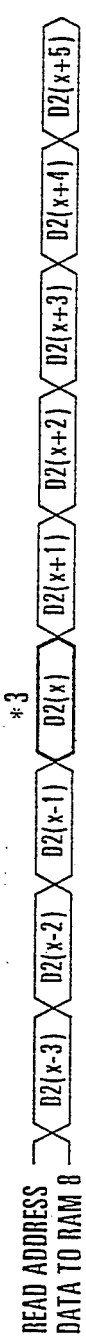
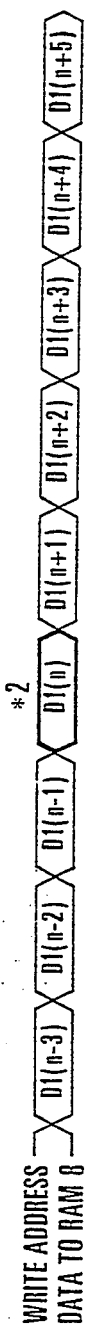

SEMICONDUCTOR MEMORY DEVICE

BACKGROUND OF THE INVENTION

The present invention relates to a semiconductor memory device constituted by a synchronous RAM and, more particularly, to a semiconductor memory device which is constituted by a plurality of synchronous RAMs and capable of writing identical data at arbitrary addresses and simultaneously reading a plurality of data.

In general, when data communication is to be performed between remote areas, phase locking between data is required. FIG. 3 illustrates a case wherein data transmission is performed between areas A, B, and C through a synchronous transmission network. In the areas A, B, and C, data transmission is performed with different phases. For this reason, when data is to be transmitted from the area A to the area C via the area B, a phase shift occurs. That is, the phase of the data on the area A side is different from that of the data on the area C side from the viewpoint of the area B.

FIG. 4 shows a case wherein when a phase in the area B is considered as a reference phase, the phase of data a from the area A is shifted from the reference phase by a phase $\theta1$, and the phase of data c to the area C is shifted from the reference phase by a phase $\theta2$. In this case, there is a phase difference $\alpha = \theta2 - \theta1$ between the data a from the area A and the data c to the area C. For this reason, the positions of pointers indicating the start data, of the respective data a and c, which are indicated by the hatched portions in FIG. 4 differ from each other. Therefore, when the positions of these read two pointers are different from each other, the phase difference $\alpha$ between the data a and c can be absorbed by correcting the phases of the two data. For this purpose, the data exhibiting the phase $\theta1$ may be temporarily written in a memory, and an address corresponding to the phase difference $\alpha$ may be designated to read the data exhibiting the phase $\theta2$ from the memory, thereby correcting the phase difference between the phases $\theta1$ and $\theta2$.

FIG. 5 shows a conventional semiconductor memory device constituted by synchronous RAMs, which is disclosed in Japanese Paten Laid-Open No. 5-100946. This device is constituted by two two-port RAMs 21 and 22. Data inputs IN of the RAMs 21 and 22 are commonly connected to a data input terminal 16. Second port address inputs P2 of the RAMs 21 and 22 are commonly connected to a write address terminal 18. First and second port clock inputs CLK1 and CLK2 of the RAMs 21 and 22 are commonly connected to a clock input terminal 20. A first port address input P1 of the RAM 21 is connected to a read address terminal 17. A first port address input P1 of the RAM 22 is connected to a read address terminal 19. In addition, a data output OUT of the RAM 21 is connected to a data output terminal 23. A data output OUT of the RAM 22 is connected to a data output terminal 24.

In the semiconductor memory device having the above arrangement, since write address data and write data are commonly supplied to the RAMs 21 and 22, identical data are written at identical addresses of the RAMs 21 and 22. On the other hand, since read addresses are independently supplied to the RAMs 21 and 22, independent data can be read out from the data output terminals 23 and 24. Note that read address data and write address data are always supplied to the RAM 21 at different timings having a difference of, e.g., one time slot, so as to prevent a read address and a write address from coinciding with each other.

In this conventional semiconductor memory device, however, since no limitations are imposed on read address data to the RAM 22, the write address of the data exhibiting the phase $\theta1$ coincides with the read address of the data exhibiting the phase $\theta2$ when the phase difference between the data a and the data c becomes zero. Such a coincidence of addresses destroys data stored in a two-port RAM on which the limitation that read and write addresses must not coincide with each other within one time slot is imposed.

SUMMARY OF THE INVENTION

It is an object of the present invention to provide a semiconductor memory device which can prevent destruction of stored data even if read and write addresses coincide with each other.

It is another object of the present invention to provide a semiconductor memory device which can obtain read data when read and write addresses coincide with each other.

In order to achieve the above objects, according to the present invention, there is provided a semiconductor memory device comprising a first RAM for simultaneously performing read and write operations in synchronism with a clock signal on the basis of write address data and read address data which is different from the write address data, a second RAM for receiving data identical to data input to the first RAM and simultaneously performing read and write operations in synchronism with a clock signal on the basis of write and read address data which are set independently of each other, comparison means for comparing read and write address data supplied to the second RAM and outputting a coincidence signal when the two address data coincide with each other, and clock stopping means for preventing destruction of stored data in the second RAM by stopping input of a clock signal to the second RAM in accordance with the coincidence signal from the comparison means.

BRIEF DESCRIPTION OF THE DRAWINGS

FIGS. 2A to 2E are timing charts for explaining the operation of the semiconductor memory device in FIG. 1;

DESCRIPTION OF THE PREFERRED EMBODIMENT

Figure 1:
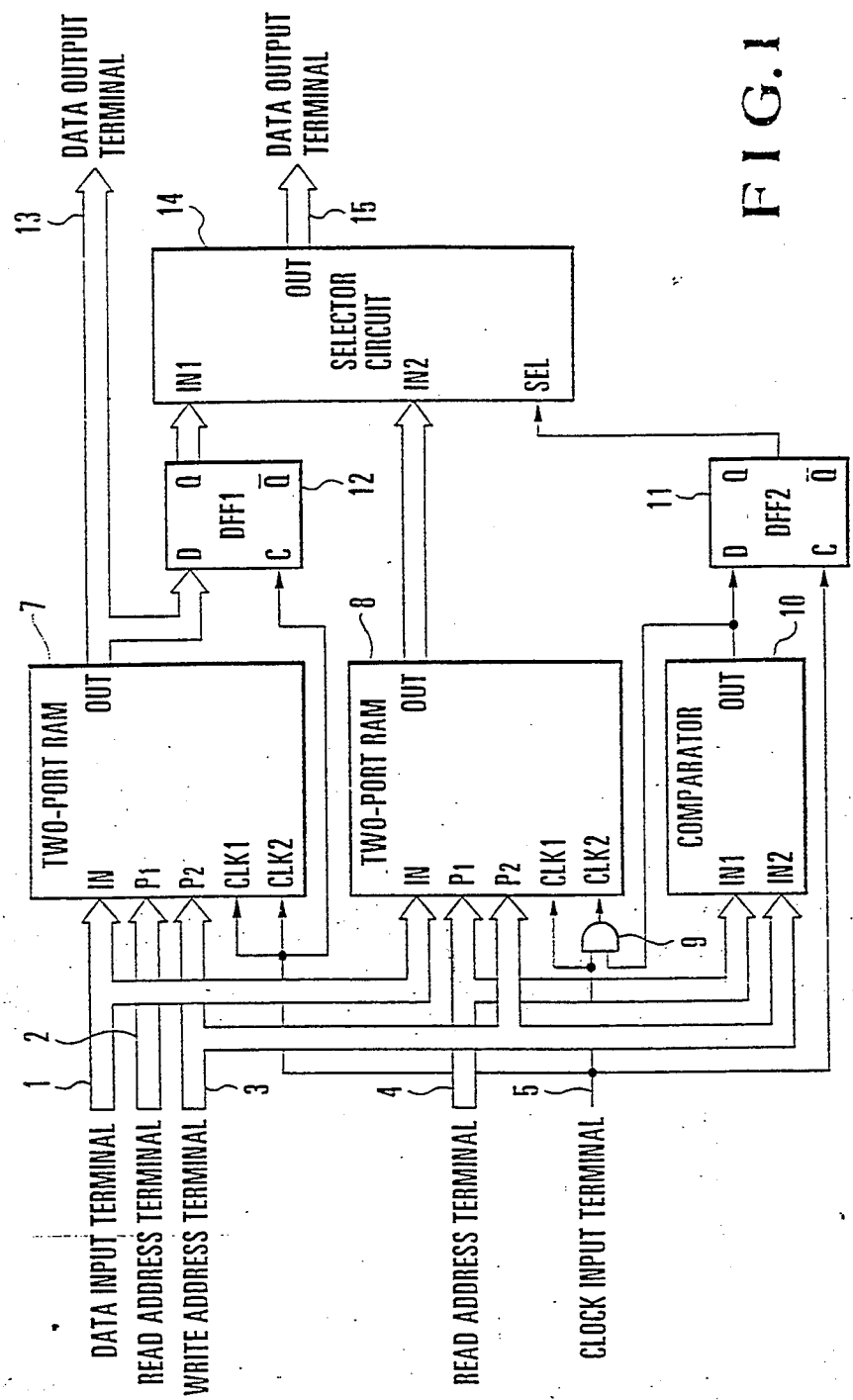
FIG. 1 is a block diagram showing the arrangement of a semiconductor memory device according to an embodiment of the present invention.
Figure 3:
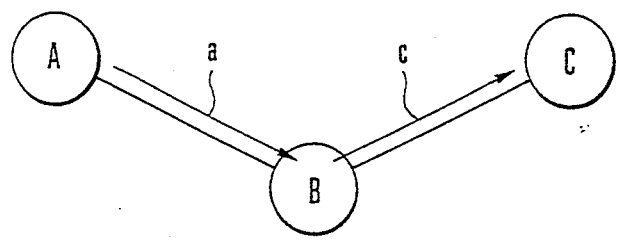
FIG. 3 is a view illustrating a case wherein a plurality of areas are connected to each other through a communication network.
Figure 4:
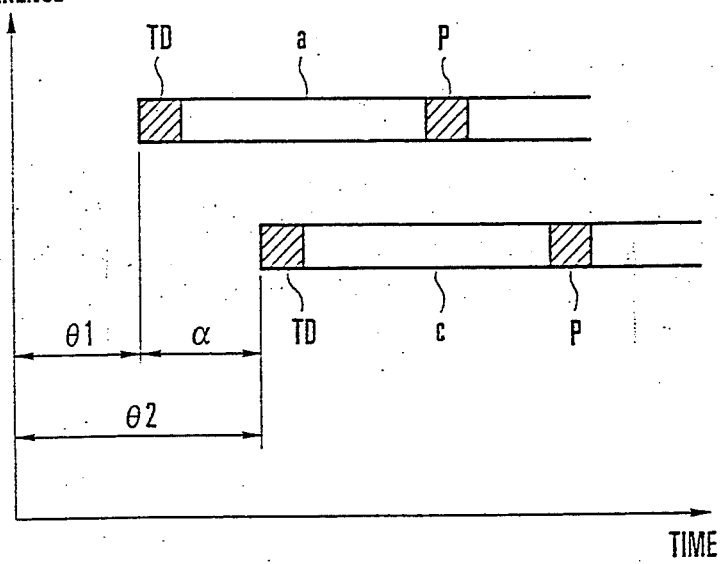
FIG. 4 is a chart showing the phase difference between data on the area A side and data on the area B side.
Figure 5:
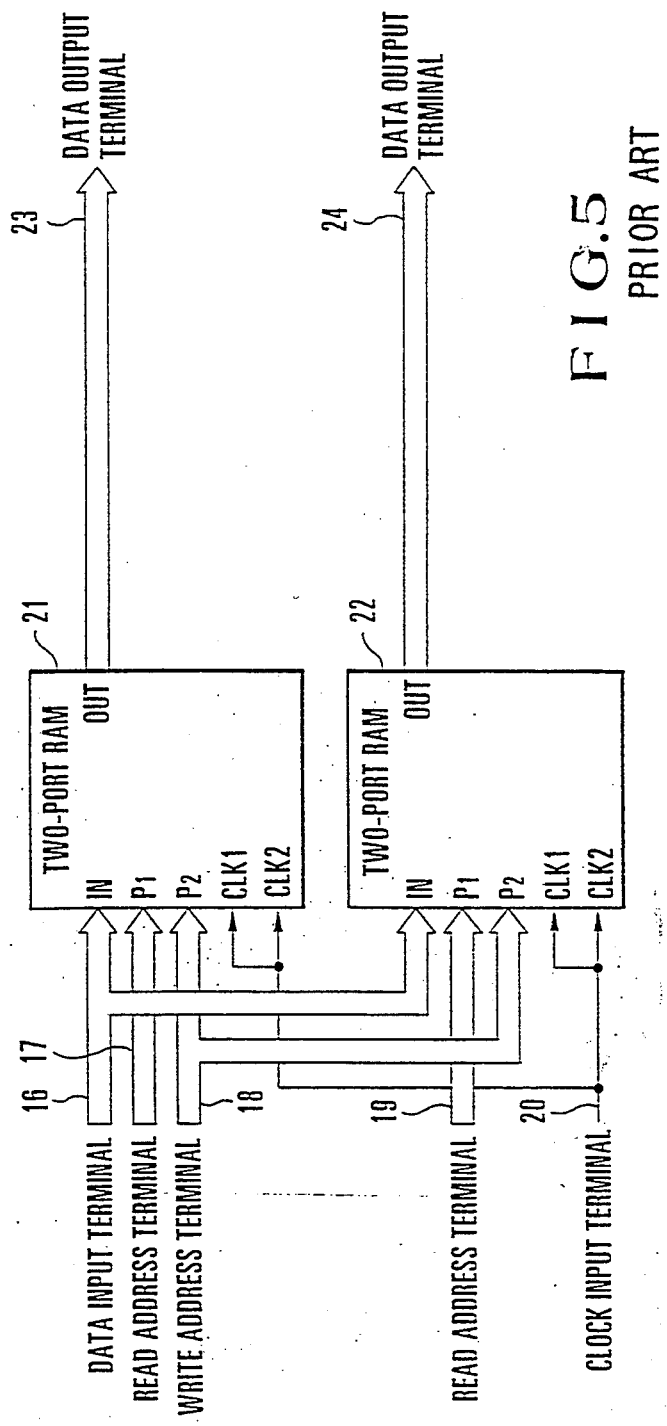
FIG. 5 is a block diagram showing the arrangement of a conventional semiconductor memory device.

FIG. 1 shows an embodiment of a semiconductor memory device of the present invention. Referring to FIG. 1, reference numerals 7 and 8 denote two-port RAMs which operate in synchronism with clocks to simultaneously perform write and read operations at one timing in one time slot. Data inputs IN of the RAMs 7 and 8 are commonly connected to a data input terminal 1. Second port address inputs P2 of the RAMs 7 and 8 are commonly connected to a write address terminal 3. A first port address input P1 of the RAM 7 is connected to a read address terminal 2. A first port address input P1 of the RAM 8 is connected to a read address terminal 4. A data output OUT of the RAM 7 is connected to a data output terminal 13 and a data input D of a D flip-flop 12. An output Q of the flip-flop 12 is connected to a first data input IN1 of a selector circuit 14. A second data input IN2 of the selector circuit 14 is connected to a data output OUT of the RAM 8. The data output OUT of the selector circuit 14 is connected to a data output terminal 15.

Reference numeral 10 denotes a comparator having two data inputs IN1 and IN2. The data inputs IN1 and IN2 of the comparator 10 are respectively connected to the read address terminal 4 and the write address terminal 3. A data output OUT of the comparator 10 is connected to a data input D of a D flip-flop 11. An output Q of the D flip-flop 11 is connected to a select control input SEL of the selector circuit 14. In addition, the output OUT of the comparator 10 is connected to one of the inputs of an AND circuit 9. The output of the AND circuit 9 is connected to a second port clock input CLK2 of the RAM 8. First and second port clock inputs CLK1 and CLK2 of the RAM 7, a first port clock input CLK1 of the RAM 8, and clock inputs C of the flip-flops 11 and 12 are commonly connected to a clock input terminal 5.

The comparator 10 compares input address data from the write address terminal 3 with input address data from the read address terminal 4, and outputs the logic value "0" to the flip-flop 11 when the data coincide with each other.

FIGS. 2A to 2E show the relationship between read and write address data supplied to the two-port RAMs 7 and 8. As indicated by reference symbol *2 in FIGS. 2C and 2E, write address data supplied to the RAMs 7 and 8 are identical to each other. As indicated by reference symbol *1 in FIG. 2B, a read address data supplied to the RAM 7 is always shifted from a write address data by one time slot. In this case, as shown in FIG. 2D, a read address supplied to the RAM 8 can take an arbitrary value. For example, the read address data indicated by reference symbol *3 in FIG. 2D, which is supplied to the RAM 8, is set such that data corresponding to data read out by read address data supplied to the RAM 7 is read out from the RAM 8. FIG. 2A shows a clock signal for defining the timings at which read and write operations are performed once in a time slot.

In the semiconductor memory device having the above-described arrangement, when read and write address data supplied to the RAM 8 are different from each other, the comparator 10, which compares these two address data, outputs the logic value "1". The D flip-flop 11 receives the output logic value "1" from the comparator 10 through the data input D, and holds it for a period of time corresponding to one time slot. The held result is input to the select control input SEL of the selector circuit 14. With this operation, the selector circuit 14 selects data from the RAM 8 and outputs it from the data output OUT to the data output terminal 15.

When read and write address data supplied to the RAM 8 coincide with each other, the comparator 10, which compares these two data, outputs the logic value "0". The D flip-flop 11 receives the output logic value "0" from the comparator 10 and holds it for a period of time corresponding to one time slot. The held result is input to the select control input SEL of the selector circuit 14.

At this time, the D flip-flop 12 keeps holding the output data from the data output OUT of the RAM 7 for a period of time corresponding to one time slot. The selector circuit 14 selects data held by the flip-flop 12 and outputs it from the data output OUT to the data output terminal 15. The output logic value "0" from the comparator 10 is also input to the AND circuit 9 to stop the input of a clock signal to the second port clock input CLK2 of the RAM 8. The RAM 8 is designed to stop its operation when no clocks are supplied to the first and second port clock inputs CLK1 and CLK2. In this case, the AND circuit 9 may be designed to stop the input of a clock signal to the first port clock input CLK1 of the RAM 8.

Referring to FIGS. 2D and 2E, when the read and write address data respectively indicated by reference symbols *3 and *2, which are supplied to the RAM 8, coincide with each other, data addressed by the write address indicated by reference symbol *2 in FIG. 2E is to be read out. In this case, the data read operation of the RAM 8 is inhibited. However, this object can be achieved by obtaining the data by some method.

The D flip-flop 12 is used to achieve the object. In this case, since the data read out from the RAM 7 by the read address data indicated by reference symbol *1 in FIG. 2B in the corresponding time slot is held by the D flip-flop 12 in the next time slot, the selector circuit 14 is selected, and the data held by the D flip-flop 12 is output to the data output terminal 15. That is, data identical to the data which is to be read out from the RAM 8 has also been written in the RAM 7 and is read out earlier than the data in the RAM 8 by one time slot. Therefore, such data are sequentially held and read out in and from the D flip-flop, and the selector circuit 14 is switched to output the data, as needed.

With this operation, data identical to the data which is to be read out from the RAM 8 by the write address indicated by reference symbol *2 in FIG. 2E can be output from the selector circuit 14. Therefore, even if read and write address data supplied to the RAM 8 coincide with each other, destruction of stored data can be prevented, and desired data can be obtained on the output side.

In the above embodiment, read and write address data supplied to the RAM 7 are shifted from each other by one time slot. For this reason, instead of reading out data from the RAM 8, identical data one time slot before the desired data in the RAM 8 is read out from the RAM 7. However, if read and write address data supplied to the RAM 7 are shifted from each other two or more time slots, approximate data one time slot before the desired data in the RAM 8 is output to the data output terminal 15.

As has been described above, according to the present invention, when read and write address data supplied to the second RAM coincide with each other, supply of a clock signal to the second RAM is stopped. Therefore, destruction of stored data can be prevented. In addition, data read out from the first RAM which is free from inhibition of supply of a clock signal is temporarily held, and the held data is output when read and write address data supplied to the second RAM coincide with each other, thereby obtaining desired data.

What is claimed is:

1. A semiconductor memory device comprising:
   a first RAM for independently performing read and write operations in synchronism with a clock signal on the basis of write address data and read address data which is different from the write address data;
   a second RAM for receiving data identical to data input to said first RAM and independently performing read and write operations in synchronism with a clock signal on the basis of write and read address data which are set independently of each other;
   comparison means for comparing read and write address data supplied to said second RAM and outputting a coincidence signal when the two address data coincide with each other; and
   clock stopping means for preventing destruction of stored data in said second RAM by stopping input of a clock signal to said second RAM in accordance with the coincidence signal from said comparison means.

2. A semiconductor memory device comprising: a first RAM for independently performing read and write operations in synchronism with a clock signal on the basis of write address data and read address data which is different from the write address data;
   a second RAM for receiving data identical to data input to said first RAM and independently performing read and write operations in synchronism with a clock signal on the basis of write and read address data which are set independently of each other, the write address data supplied to said first and second RAMs and read address data supplied to said first RAM one clock before the write address data being set to be identical to each other;
   comparison means for comparing read and write address data supplied to said second RAM and outputting a coincidence signal when the two address data coincide with each other; and
   clock stopping means for preventing destruction of stored data in said second RAM by stopping input of a clock signal to said second RAM in accordance with the coincidence signal from said comparison means.

3. A semiconductor memory device comprising:
   a first RAM for independently performing read and write operations in synchronism with a clock signal on the basis of write address data and read address data which is different from the write address data;
   a second RAM for receiving data identical to data input to said first RAM and independently performing read and write operations in synchronism with a clock signal on the basis of write and read address data which are set independently of each other;
   comparison means for comparing read and write address data supplied to said second RAM and outputting a coincidence signal when the two address data coincide with each other;
   clock stopping means for preventing destruction of stored data in said second RAM by stopping input of a clock signal to said second RAM in accordance with the coincidence signal from said comparison means; and
   data hold means for holding output data from said first RAM until one clock is input, and data selection means for receiving read data from said second RAM and output data from said data hold means and selecting/outputting the output data from said data hold means instead of the read data from said second RAM upon reception of the coincidence signal from said comparison means.

4. A semiconductor memory device comprising:
   a first RAM for independently performing read and write operations in synchronism with a clock signal on the basis of write address data and read address data which is different from the write address data;
   a second RAM for receiving data identical to data input to said first RAM and independently performing read and write operations in synchronism with a clock signal on the basis of write and read address data which are set independently of each other, said first and second RAMS being constituted by two-port RAMs, each having a read address input, to which read address data is supplied, and a write address input, to which write address data is input, the write address inputs and data inputs of said first and second RAMs being connected to each other;
   comparison means for comparing read and write address data supplied to said second RAM and outputting a coincidence signal when the two address data coincide with each other; and
   clock stopping means for preventing destruction of stored data in said second RAM by stopping input of a clock signal to said second RAM in accordance with the coincidence signal from said comparison means.

5. A semiconductor memory device comprising:
   a first RAM for independently performing read and write operations in synchronism with a clock signal on the basis of write address data and read address data which is different from the write address data;
   a second RAM for receiving data identical to data input to said first RAM and independently performing read and write operations in synchronism with a clock signal on the basis of write and read address data which are set independently of each other;
   comparison means for comparing read and write address data supplied to said second RAM and outputting a coincidence signal when the two address data coincide with each other; and
   clock stopping means for preventing destruction of stored data in said second RAM by stopping input of a clock signal to said second RAM in accordance with the coincidence signal from said comparison means, said clock stopping means being constituted by an AND circuit for receiving both the clock signal and the coincidence signal from said comparison means.

6. A semiconductor memory device comprising:
   first and second RAMs, each having a data input, a read address input, a write address input, a clock input, and a data output and designed to independently perform read and write operations in synchronism with a clock signal input to the clock input;
   a data input terminal for commonly inputting data to the data inputs of said first and second RAMs;
   address read terminals for separately inputting read address data to the read address inputs of said first and second RAMs;
   an address write terminal for commonly inputting address data to the write address inputs of said first and second RAMs;

a clock input terminal for commonly inputting a clock signal to the clock inputs of said first and second RAMs;

data output terminals for separately outputting read data from the data outputs of said first and second RAMs;

comparison means for comparing read and write address data supplied to said second RAM and outputting a coincidence signal when the two address data coincide with each other; and clock stopping means for preventing destruction of stored data in said second RAM by stopping input of a clock signal to the clock input of said second RAM in accordance with the coincidence signal from said comparison means.

* * * * *